(12) United States Patent
Liptak et al.

(10) Patent No.: US 6,184,464 B1
(45) Date of Patent: Feb. 6, 2001

(54) PROTECTIVE CONTAINMENT APPARATUS FOR POTTED ELECTRONIC CIRCUITS

(75) Inventors: Julius M. Liptak, Knightdale, NC (US); Michael Joseph Gerlach, Riverview, FL (US)

(73) Assignee: Square D Company, Palatine, IL (US)

( * ) Notice: Under 35 U.S.C. 154(b), the term of this patent shall be extended for 0 days.

(21) Appl. No.: 09/067,118

(22) Filed: Apr. 27, 1998

(51) Int. Cl.[7] .................................................. H01L 23/02
(52) U.S. Cl. .......................... 174/52.4; 257/683; 257/790; 257/729
(58) Field of Search ................................ 174/52.2, 52.4, 174/52.3; 257/683, 729, 790; 361/752; 264/272.11, 272.15

(56) References Cited

U.S. PATENT DOCUMENTS

| | | | |
|---|---|---|---|
| 4,227,037 | * | 10/1980 | Layton ............................ 174/35 MS |
| 4,274,106 | * | 6/1981 | Ohdate ................................... 357/79 |
| 4,399,452 | * | 8/1983 | Nakashima et al. ................... 357/74 |
| 5,097,317 | * | 3/1992 | Fujimoto et al. ...................... 357/72 |
| 5,539,218 | * | 7/1996 | Takahama et al. .................. 257/788 |
| 5,606,200 | * | 2/1997 | Haraguchi et al. .................. 257/687 |
| 5,686,758 | * | 11/1997 | Arai et al. ............................ 257/693 |
| 5,726,386 | * | 3/1998 | Calhoun ............................... 174/52.2 |
| 5,977,621 | * | 11/1999 | Stuck .................................... 257/683 |

* cited by examiner

Primary Examiner—Kristine Kincaid
Assistant Examiner—W. David Walkenhorst
(74) Attorney, Agent, or Firm—David R. Stacey; Larry T. Shrout; Larry I. Golden (57) ABSTRACT

A protective containment apparatus for preventing damage to expensive components of an assembly due to the failure of an electronic component in a nearby potted circuit which is known to fail catastrophically. The containment apparatus can employ a resilient material 38 placed around the at-risk electronic component 34 prior to potting the circuit. The resilient material 38 absorbs the expanding gases and fragmented parts of the at-risk component 34 which are expelled during the catastrophic failure. The cushioning effect of the resilient material 38 prevents the fragments and parts of the potting material from becoming projectiles that can damage any nearby components of the assembly. The containment apparatus can also employ a restrictive material 42 placed around the at-risk component 34 prior to potting the circuit. The restrictive material 42 prevents any expelled fragments of the at-risk component 34 and expanding gases from causing the potting material to fracture and become projectiles which can damage nearby components of the assembly. A combination of the resilient material 34 and the restrictive material 42 can also be employed and is most effective in preventing damage to nearby component of the assembly.

2 Claims, 7 Drawing Sheets

PROTECTIVE CONTAINMENT APPARATUS FOR POTTED ELECTRONIC CIRCUITS

FIELD OF THE INVENTION

The present invention relates to electronic circuits and particularly to a protective containment apparatus for preventing the damage of nearby components due to the catastrophic failure of an electronic component in potted circuit.

BACKGROUND OF THE INVENTION

The potting of electronic circuits has long been a method of protecting circuit components from the effects of vibration or to make the work of potential copiers very difficult. To accomplish these goals the circuit is generally partially or completely surrounded by an enclosure of some type. A liquid potting material is poured or forced into the enclosure such that it completely fills the enclosure and surrounds most or all of the electronic components. The potting material then solidifies into a very hard material that can not easily be removed from the electrical components it surrounds. The electronic components surrounded by the hardened potting material are protected from damage by vibration and, to some degree, from being reverse engineered. The potting material performs its intended purpose very well; however, major damage to other nearby components of the assembled device can occur when a catastrophic failure of one of the potted electronic components occurs. Some electronic devices fail in an explosive manner as a result of rapidly expanding gases produced by the deterioration of the electrical component material due to heat and electrical arcing. If sufficient gases are produced by the failing component, parts of the failing component, hot plasma and pieces of potting material will form a number of large and small projectiles rapidly expelled from the failing component. These projectiles can cause major damage to any mechanical or electrical components that are near the potted electronic circuit. Thus, the failed potted electronic circuit, which may be inexpensive to replace, can cause damage to very expensive nearby components, which then must also be replaced due to the failure of the potted circuit. It would therefore be desirable to provide additional protection for those electronic components that tend to fail in an extremely explosive manner such that the surrounding potting material is not expelled as projectiles.

SUMMARY OF THE INVENTION

The present invention provides a simple method of preventing the catastrophic failure of an electronic component in a potted circuit from causing damage to nearby elements of the assembly. Electronic elements known to fail in an explosive manner are surrounded by either a resilient cushion like material or a restrictive material or a combination of both prior to potting the circuit. The resilient material provides a cushioned space for the expanding gases of the failing component, thus preventing pieces of the failing component and/or the hard potting material from being expelled as projectiles. The restrictive material tends to restrict or slow the expanding gases thus preventing the potting material from being expelled away from the failing component. A combination of the resilient material and restrictive material permits limited expansion of the gases and further restricts the expansion such that the potting material is not compromised. A thin layer of the resilient material is positioned such that it surrounds the at-risk electronic component. For purposes of description herein, an at-risk electronic component is one that can fail in an explosive manner. The restrictive material is wrapped around the at-risk electronic component to prevent it from expanding due to the produced gases. The combination of cushion and wrap is accomplished by positioning the resilient material around the at-risk electronic component and then wrapping the resilient material with the restrictive material, thus limiting the amount of expansion that the gases can produce. Both methods provide a method of prohibiting or significantly restricting the amount of potting material which can expelled by the catastrophic failure of the at-risk electronic component.

Before one embodiment of the invention is explained in detail, it is to be understood that the invention is not limited in its application to the details of construction described herein or as illustrated in the drawings. The invention is capable of other embodiments and of being practiced or being carried out in various other ways. Also, it is to be understood that the phraseology and terminology used herein is for the purpose of description and should not be regarded as limiting.

DESCRIPTION OF THE PREFERRED EMBODIMENT

Figure 1:
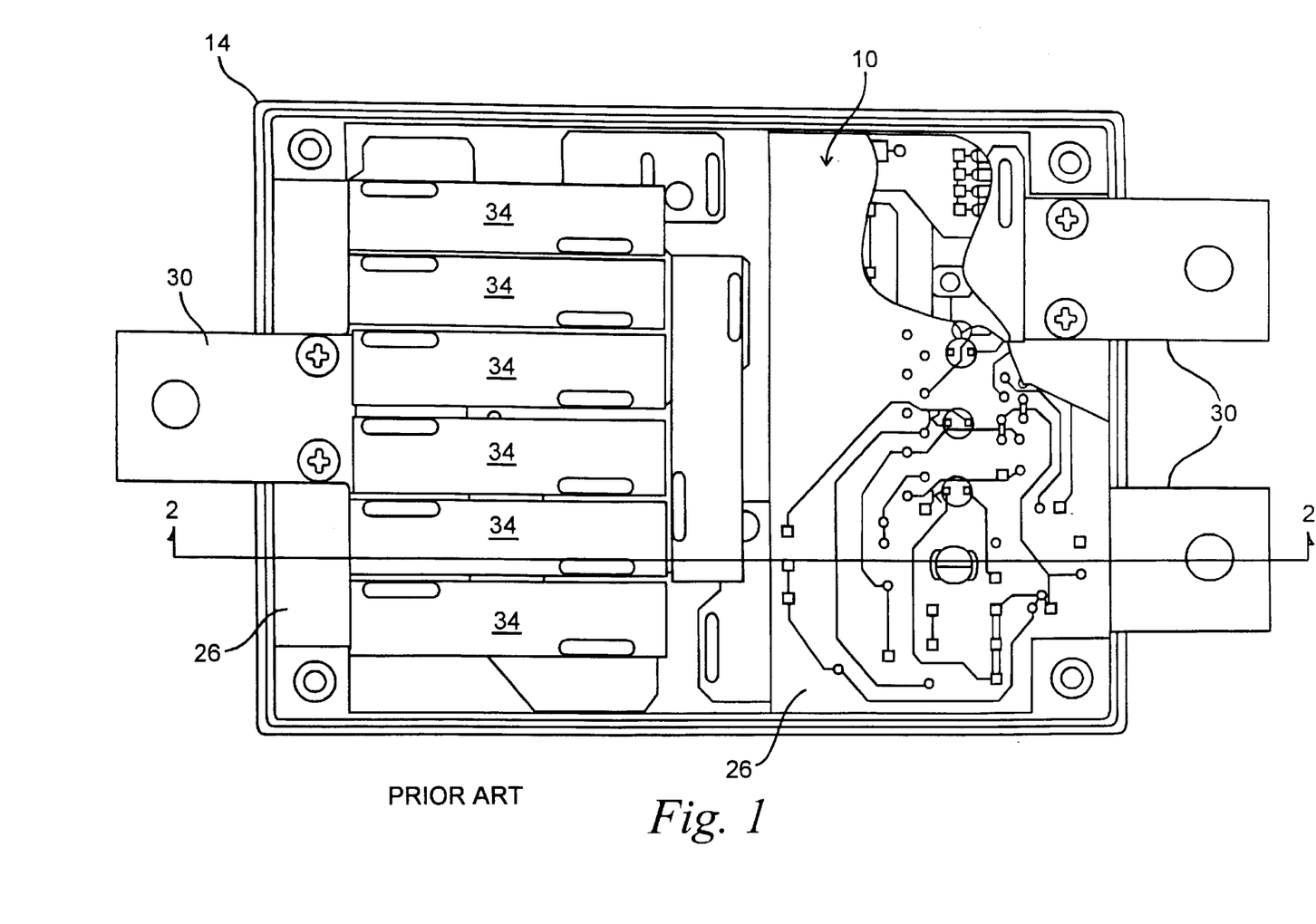
FIG. 1 is a top view of an electronic circuit of the prior art prior to adding a potting material.
Figure 2:
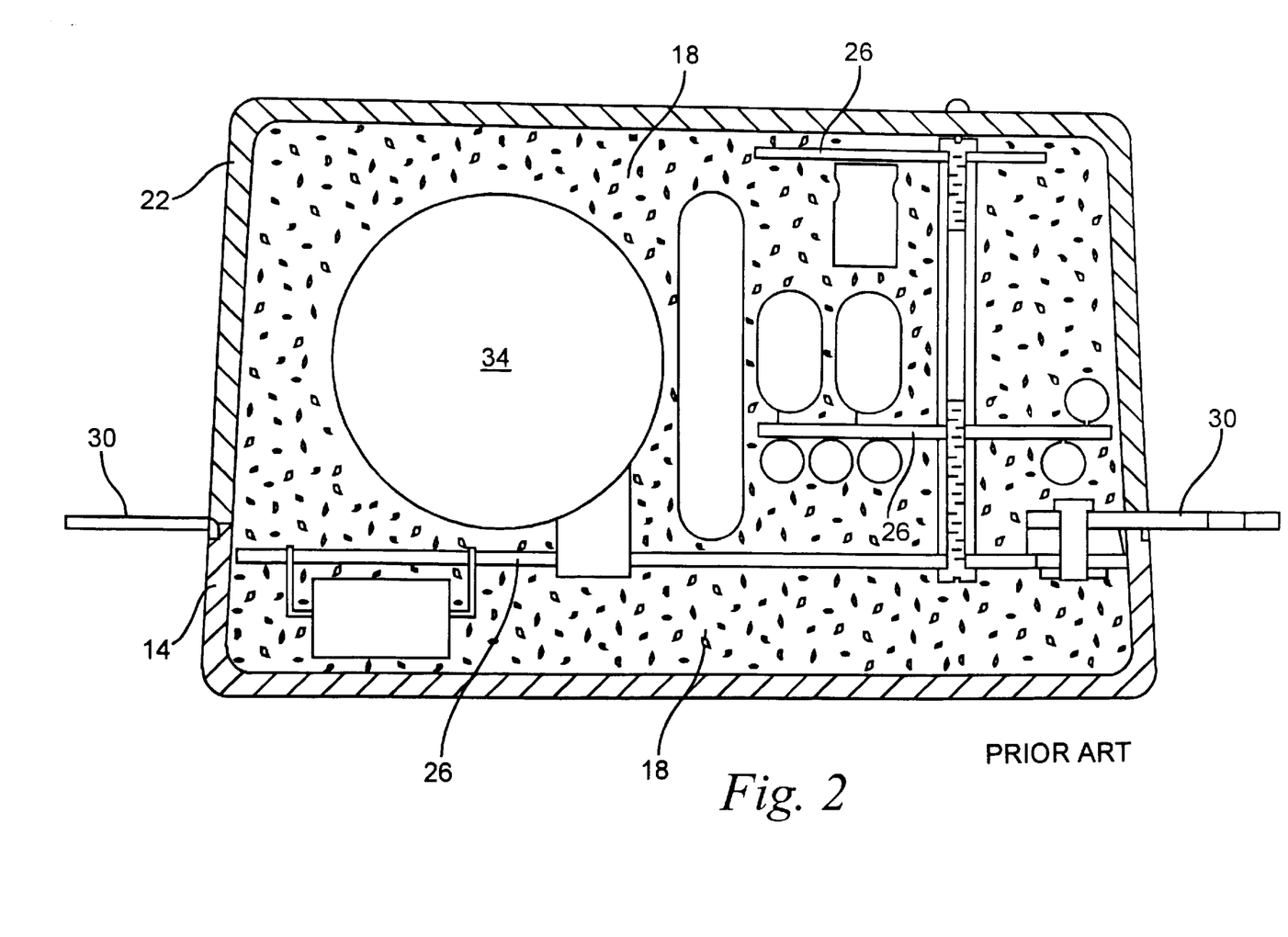
FIG. 2 is a cross-sectional view of the potted electronic circuit taken along line 2—2 of FIG. 1 with cover installed.
Figure 3A:
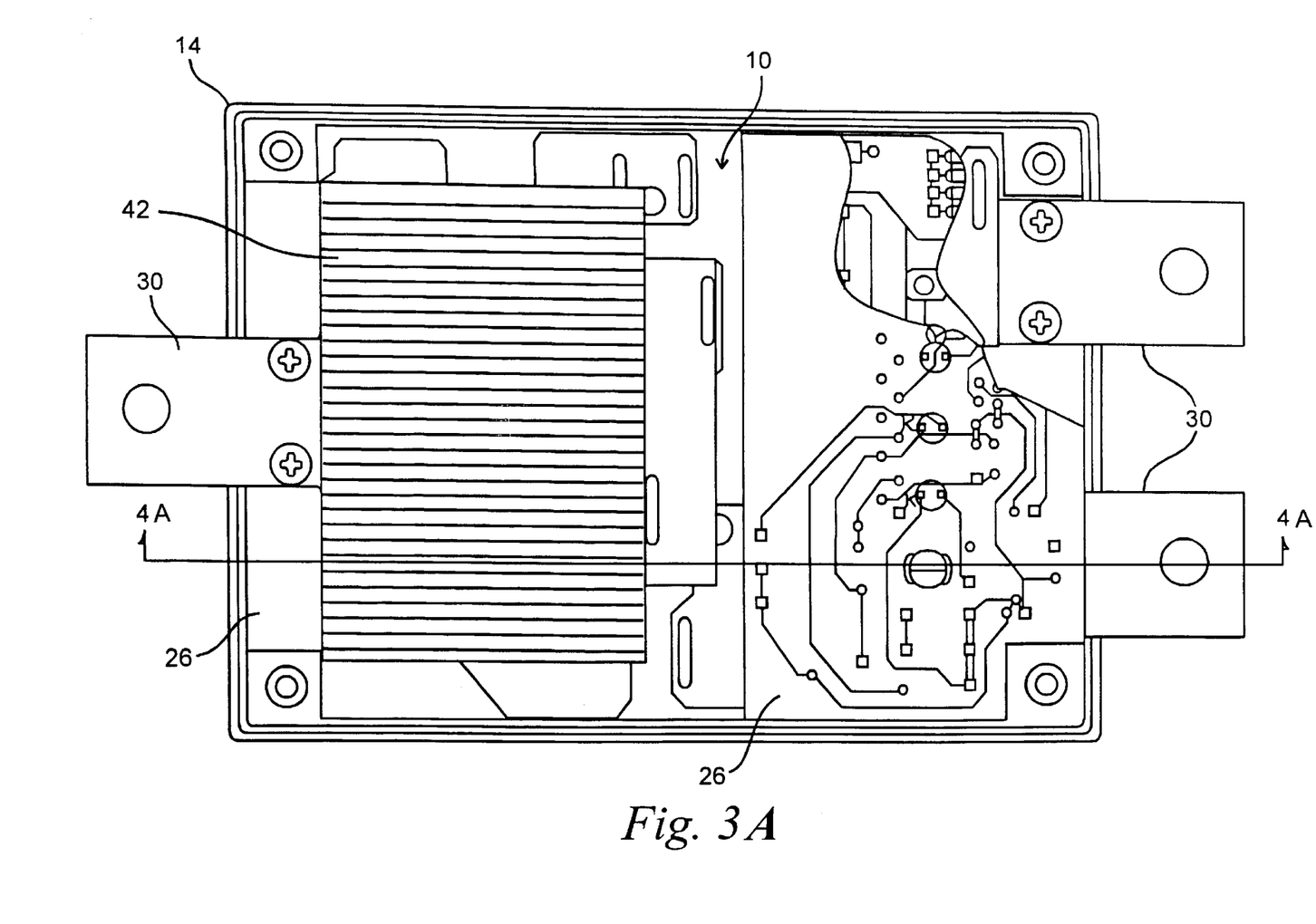
FIG. 3A is a top view of an electronic circuit configured in accordance with the present invention prior to adding a potting material and illustrating the restrictive material 42 installed around the at-risk components.
Figure 3B:
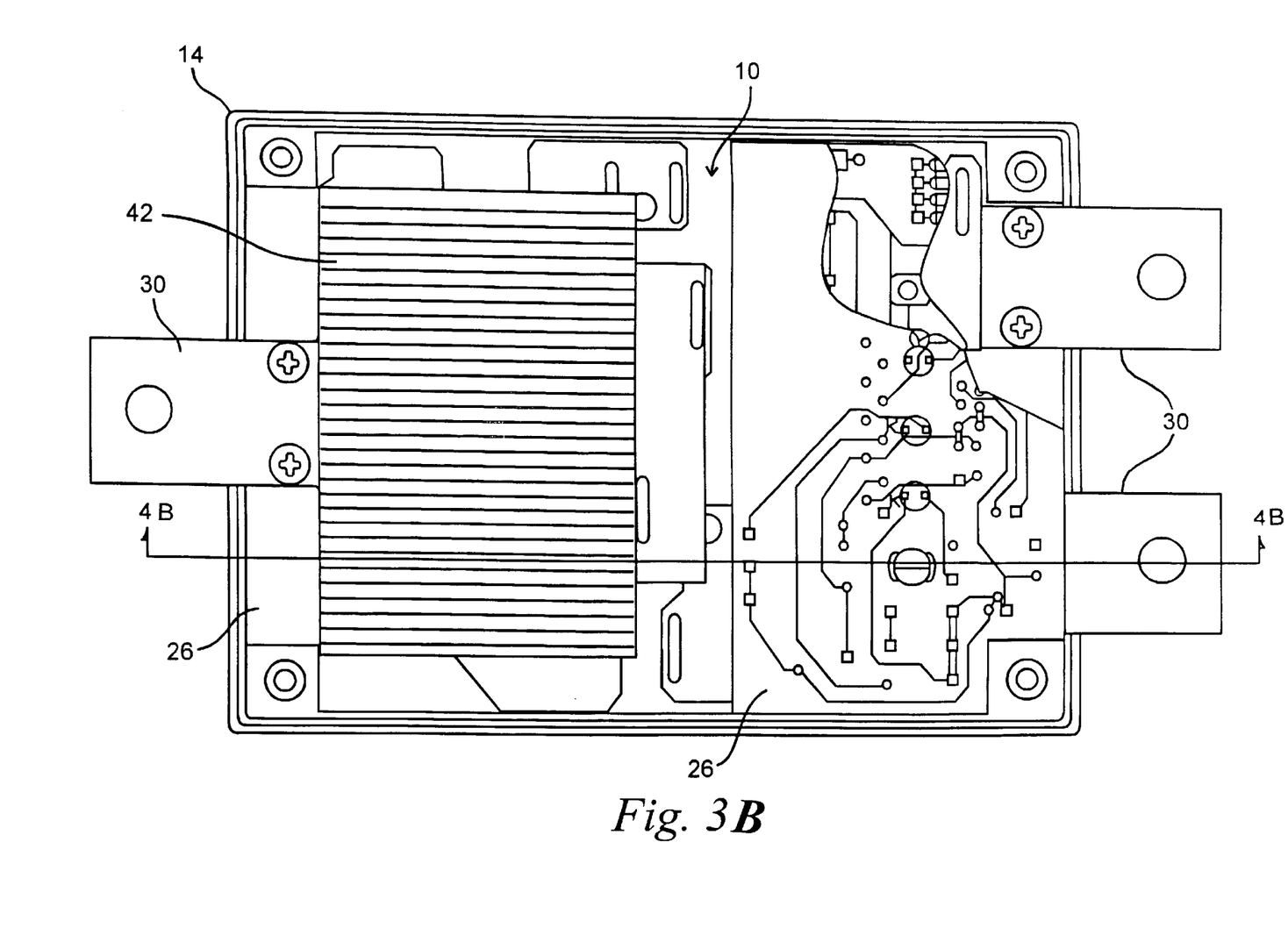
FIG. 3B is a top view of an electronic circuit configured in accordance with the present invention prior to adding a potting material and illustrating the resilient and restrictive materials, 38 and 42 respectively, installed around the at-risk components.
Figure 4A:
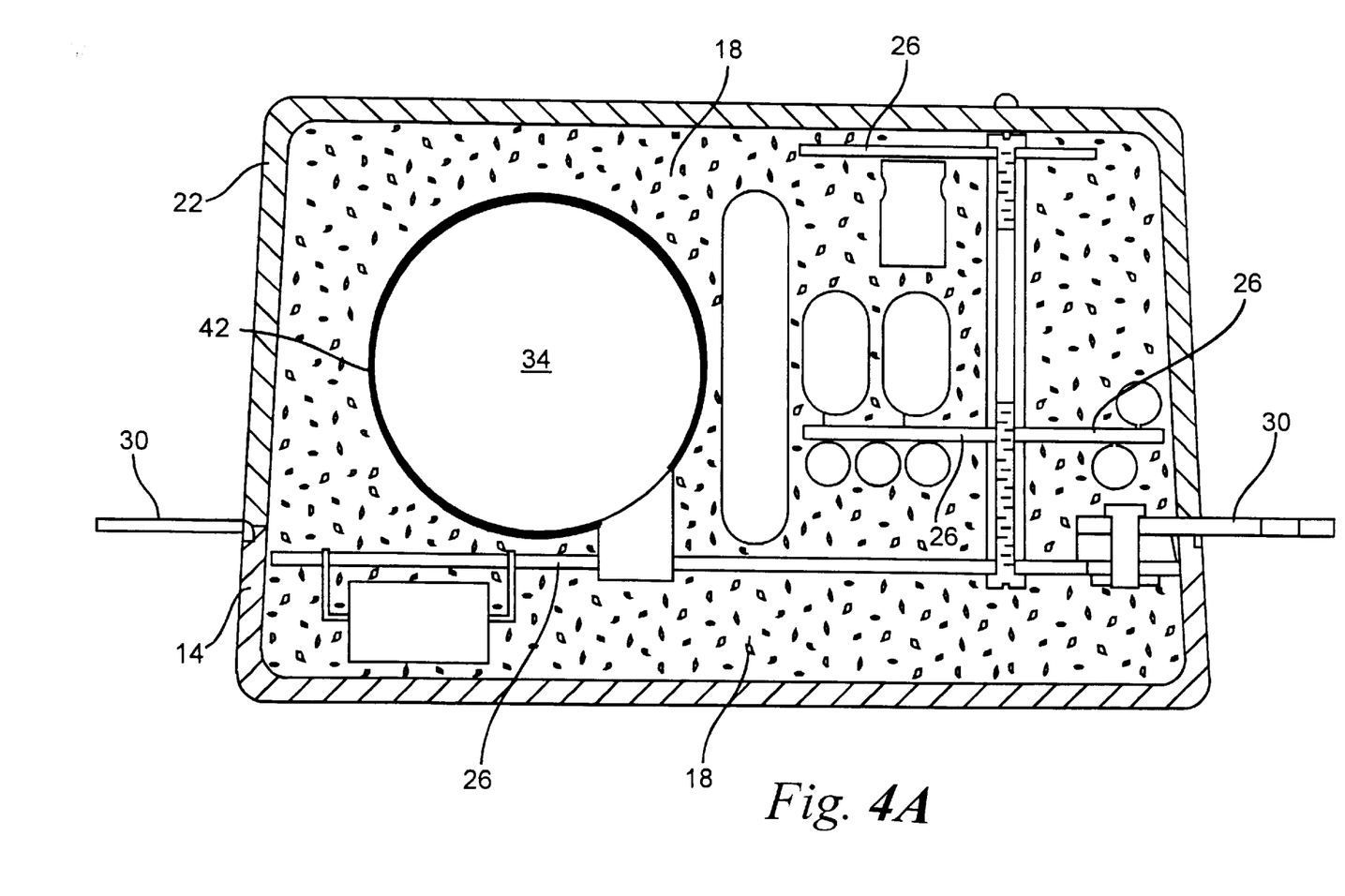
FIG. 4A is a cross-sectional view of the potted electronic circuit taken along line 4A—4A of FIG. 3A illustrating at-risk components surrounded by a restrictive material 42 in accordance with the present invention.
Figure 4B:
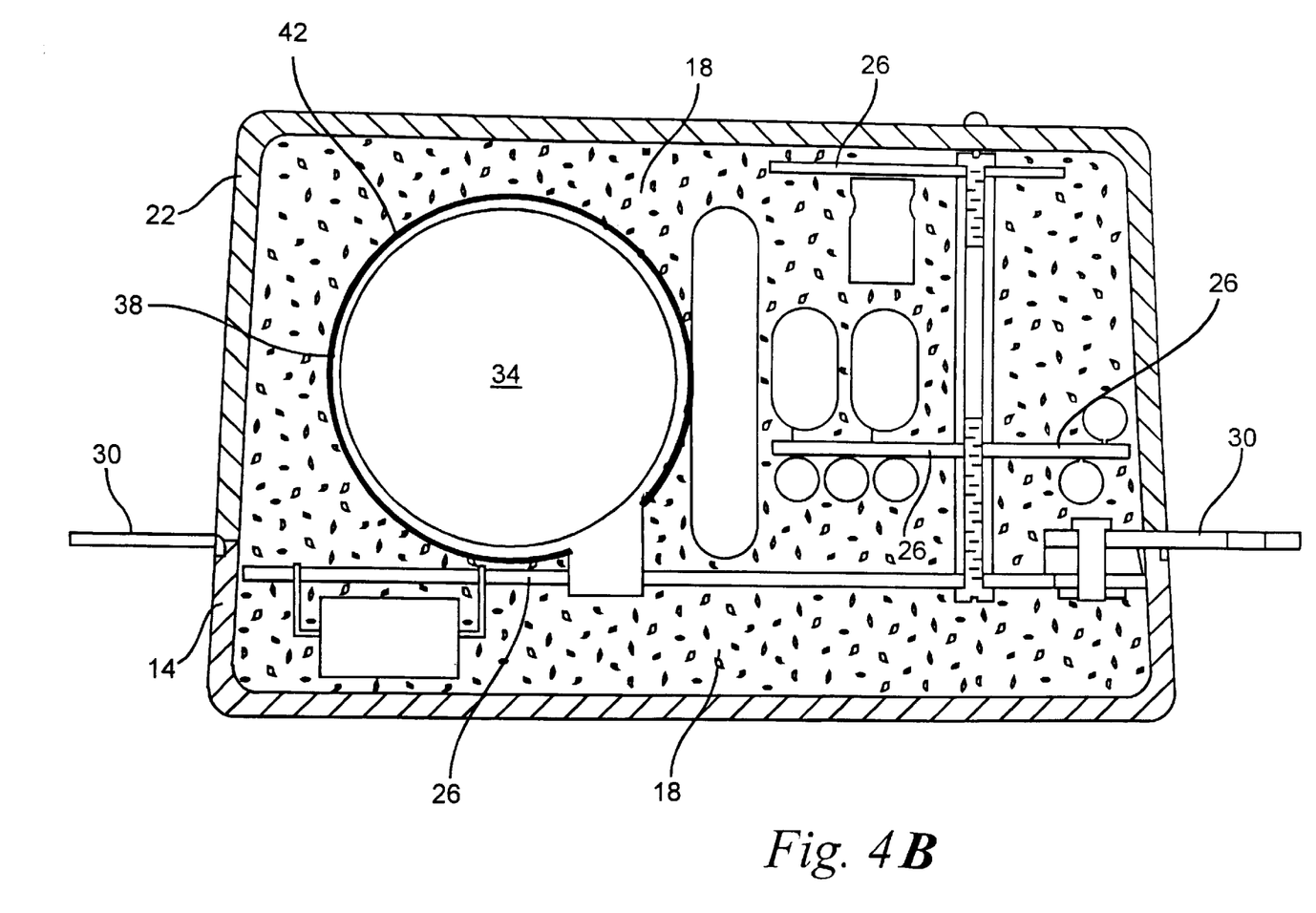
FIG. 4B is a cross-sectional view of the potted electronic circuit taken along line 4B—4B of FIG. 3B illustrating at-risk components surrounded by the resilient and restrictive materials, 38 and 42 respectively, in accordance with the present invention.

FIGS. 1 and 2 illustrate a potted electronic circuit typical of the prior art and generally indicated by reference numeral 10. The circuit 10 is installed in an enclosure 14 that provides a form for the potting material 18 and can include a cover 22, as shown in FIG. 2. The circuit 10 consists of a number of electronic components assembled on a printed circuit board 26. Terminals 30 are electrically connected to the printed circuit board 26 and pass through the enclosure 14 for connection to other electronic circuits or components in the assembled device. The circuit 10 used as an example in this application is a Transient Voltage Surge Suppressor (TVSS). However, any electronic circuit 10 which includes at-risk electronic devices, generally indicated by reference numeral 34, which tend to fail catastrophically, can use the technology of the present invention to protect expensive components near the potted circuit 10. The TVSS circuit 10 includes a number of Metal Oxide Varistors (MOV's) that tend to fail catastrophically and therefore are the at-risk electronic components 34 of the example circuit 10.

FIGS. 3A, 3B, 4A, and 4B illustrate a potted electronic circuit assembled in accordance with the present invention. The at-risk components 34 are generally separated or spaced apart from the potting material 18 by a resilient material 38 which absorbs the pressure from the gases produced by the failing components 34. The density of the resilient material 38 must be significantly less than the density of the potting material such that the expanding gases and particles of the at-risk component 34 can be absorbed without causing the potting material to fracture and be expelled. The resilient material 38 can be provided in any one of various manners such as sheet material which is wrapped around the at-risk component 34, molded or extruded material dimensioned to closely receive the at-risk component 34, or a generally fluid material which is poured or otherwise positioned around the at-risk component 34 prior to potting the circuit 10. The resilient material 38 must be of, or must cure to, a consistency which will allow it to be compressed by the expanding gases from the failing at-risk component 34. A commercially available material, which has been found to meet this requirement, is FOAMEGA silicon foam sheeting manufactured by Rogers Brisco. By absorbing the pressure of the gas produced by and any fragmented parts of the failing at-risk component 34, the resilient material 38 prevents fragments of the at-risk component 34 and the surrounding potting material 18 from being dislodged and becoming projectiles that can cause major damage to other expensive components in the assembled product.

Another method of providing protection for the at-risk component 34 is to wrap the component 34 with a restrictive material 42 which substantially maintains the structural integrity of the at-risk component 34 during a catastrophic failure and provides for limited expansion of the expanding gases. The restrictive material 42 must be sufficiently flexible that it can easily conform to the shape of the at-risk component 34, have sufficient strength to substantially maintain the structural integrity of the at-risk component 34, and be thin enough that multiple wraps of the restrictive material 42 can be applied if required. A commercially available product, such as Scotch 69 glass tape manufactured by 3M Company, meets these requirements. Other forms of glass reinforced materials can be used as an alternative to the tape product described above. A combination of the resilient material 38 and the restrictive material 42 has been found to be most effective. The at-risk component 34 is first surrounded by the resilient material 38 and then wrapped with the restrictive material 42, providing both adequate expansion space and restriction to substantially insure the structural integrity of the at-risk component 34.

Figure 5:
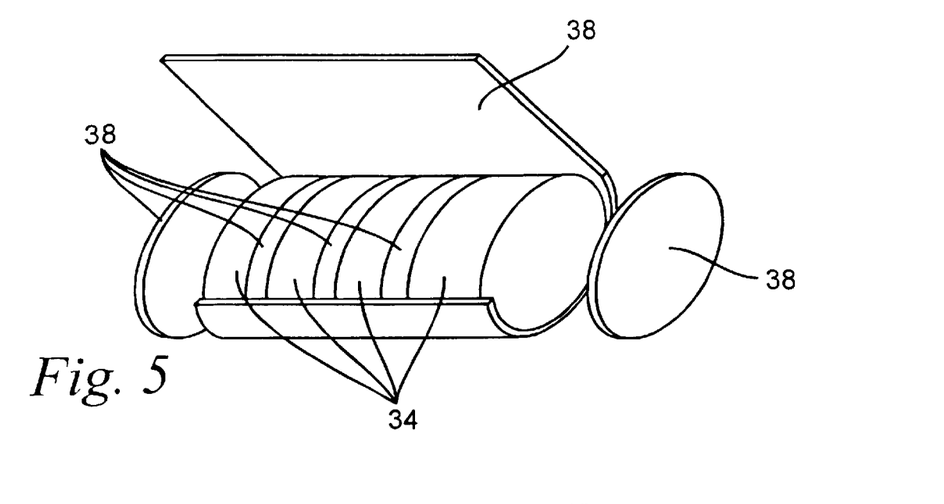
FIG. 5 is an illustration of an at-risk electronic device surrounded by a resilient material.

FIG. 5 illustrates positioning of the resilient material 38 around and between a number of at-risk component 34 such as the MOV's of the example circuit. The circular shape of the MOV's is easily covered by a flat sheet of the resilient material 38. At-risk components 34 of irregular shapes can require extruded or molded shapes dimensioned to closely surround their particular shape.

Figure 6:
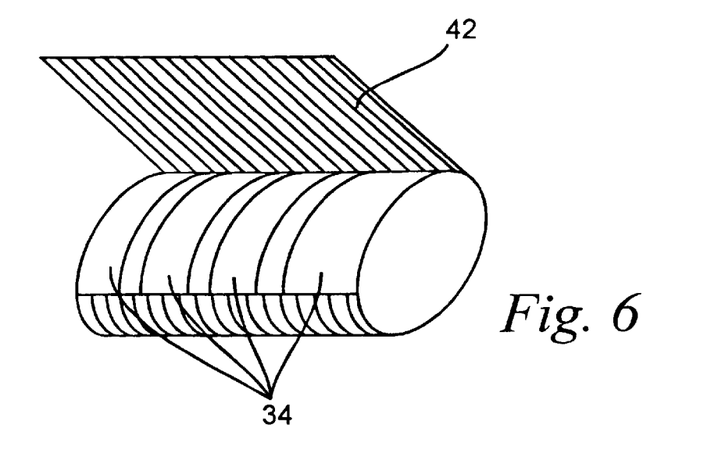
FIG. 6 is an illustration of an at-risk electronic device surrounded by a restrictive material.

FIG. 6 illustrates positioning of the restrictive material 42 around an at-risk component 34, such as an MOV of the example circuit. The restrictive material 42 is generally a tape or wrappable material incorporating fiber glass strands or similar materials having high strength fibers which allow limited stretching, but are not easily broken. The restrictive material 42 must also be sufficiently flexible that it can be easily wrapped around the at-risk component 34 or the resilient material 38.

Figure 7:
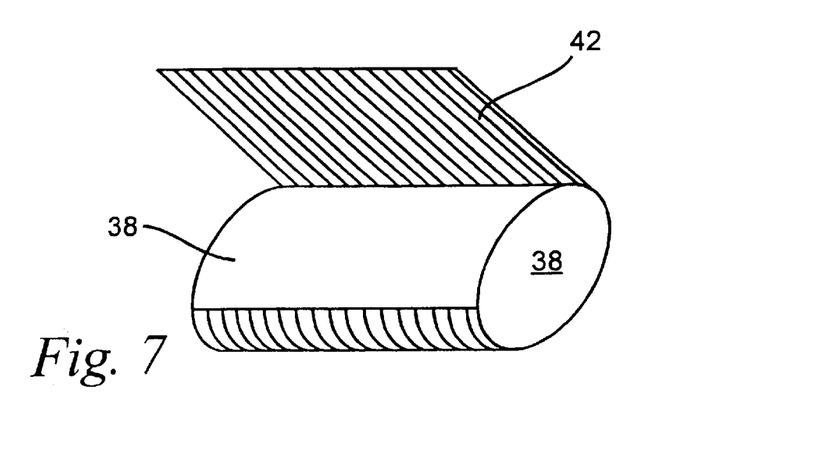
FIG. 7 is an illustration of an at-risk electronic device surrounded by both a resilient and a restrictive material.

FIG. 7 illustrates positioning of both the resilient material 38 and the restrictive material 42 on and around an at-risk component 34 such as an MOV of the example circuit. When the restrictive material 42 is used in combination with a resilient material 38, it should not be wrapped about the resilient material 38 so tightly that the resilient material 38 is compressed. Compression of the resilient material 38 will prevent it from absorbing the expanding gases and component particles expelled by the catastrophic failure of the at-risk component 34.

We claim:

1. A containment apparatus for protecting nearby components of an assembly from damage by the failure of an at-risk electronic component which is known to fail in a catastrophic manner and which is located in a potted electronic circuit, said containment apparatus comprising:

a resilient material placed around the at-risk component; and a restrictive material placed around the resilient material prior to potting the electronic circuit.

2. The containment apparatus of claim 1 wherein said resilient material and said restrictive material prevent the fracturing and expelling of projectiles comprised of particles of the at-risk component and the potting material and the escape of hot gases which can cause major damage to nearby components of the assembly.

* * * * *

UNITED STATES PATENT AND TRADEMARK OFFICE
CERTIFICATE OF CORRECTION

PATENT NO. : 6,184,464 B1 Page 1 of 1
APPLICATION NO. : 09/067118
DATED : February 6, 2001
INVENTOR(S) : Julius M. Liptak and Michael J. Gerlach It is certified that error appears in the above-identified patent and that said Letters Patent is hereby corrected as shown below:

Title page item (73) Assignee, please add --Advanced Protection Technologies, Inc., Clearwater, Florida (US)--.

Signed and Sealed this

Nineteenth Day of September, 2006

JON W. DUDAS
*Director of the United States Patent and Trademark Office*